United States Patent
Yu et al.

(10) Patent No.: US 6,194,942 B1
(45) Date of Patent: Feb. 27, 2001

(54) PREDISTORTION CIRCUIT FOR LINEARIZATION OF SIGNALS

(75) Inventors: Ben-Mou Yu; Fu-Chin Shen, both of Taipei Hsien (TW)

(73) Assignee: Cable Vision Electronics Co., Ltd., Chung-Ho (TW)

( * ) Notice: Subject to any disclaimer, the term of this patent is extended or adjusted under 35 U.S.C. 154(b) by 0 days.

(21) Appl. No.: 09/487,057

(22) Filed: Jan. 19, 2000

(51) Int. Cl.[7] ............................... H03K 5/08; H03L 5/00
(52) U.S. Cl. ..................... 327/317; 327/355; 327/362; 330/149; 375/285; 375/296; 359/161
(58) Field of Search ................... 327/317, 362, 327/346, 348, 349, 403, 355, 356; 330/149–151; 359/153, 161; 455/63; 375/296, 285

(56) References Cited

U.S. PATENT DOCUMENTS

| | | | |
|---|---|---|---|
| 5,252,930 | * 10/1993 | Blauvelt | 330/149 |
| 5,304,945 | * 4/1994 | Myer | 330/149 |
| 5,363,056 | * 11/1994 | Blauvelt | 330/149 |
| 5,424,680 | * 6/1995 | Zazarathy et al. | 330/149 |
| 5,939,920 | * 4/1999 | Hiraizumi | 327/317 |
| 6,055,278 | * 4/2000 | Ho et al. | 375/296 |
| 6,081,156 | * 6/2000 | Choi et al. | 330/149 |
| 6,100,757 | * 8/2000 | Kotzamanis | 330/149 |
| 6,104,241 | * 8/2000 | Cova et al. | 330/149 |

* cited by examiner

Primary Examiner—Terry D. Cunningham
Assistant Examiner—Long Nguyen
(74) Attorney, Agent, or Firm—Townsend and Townsend and Crew LLP

(57) ABSTRACT

A predistortion circuit includes a first splitter for splitting an input signal into primary and secondary electrical paths, a first combiner for combining a main signal on the primary electrical path and a predistorted signal on the second electrical path into a single signal for modulating a nonlinear device with predictable distortion characteristics, a distortion signal generator for receiving a branch signal from the first splitter and for producing first and second intermodulation products, a second splitter for receiving the first intermodulation products and for outputting two sets of the first intermodulation products, a third splitter for receiving the second intermodulation products and for outputting two sets of the second intermodulation products, an even-order signal processing unit for processing one set of the first intermodulation products and one set of the second intermodulation products to generate even-order intermodulation products, an odd-order signal processing unit for processing the other set of the first intermodulation products and the other set of the second intermodulation products to generate odd-order intermodulation products, and a second combiner for combining the even-order intermodulaton products and the odd-order intermodulation products to obtain the predistortion signal.

6 Claims, 4 Drawing Sheets

PREDISTORTION CIRCUIT FOR LINEARIZATION OF SIGNALS

BACKGROUND OF THE INVENTION

1. Field of the Invention

The invention relates to a predistortion circuit for providing a linear output from a transmission device which has an output distorted from its input due to inherent nonlinearly, more particularly to a predistortion circuit that has a simple construction.

2. Description of the Related Art

It is well known to modulate the analog intensity of an optical source, such as a semiconductor laser, using an electric signal, in order to transmit analog signals, such as sound or video signals, on optical fibers. Distortion inherent in analog transmitters prevents an electrical modulation signal from being converted linearly to an optical signal, and instead distorts the signal. This is especially problematic with a multi-channel video transmission system, such as cable television. Therefore, a predistortion circuit is used to reduce the distortion inherent in nonlinear devices.

Referring to FIG. 1, optical power intensity of a nonlinear semiconductor laser in relation to current flowing therethrough is determined according to the following Equation 1:

$$P_{out}=a_1 I + a_2 I^2 + a_3 I^3 + \quad \text{(Equation 1)}$$

where "$P_{out}$" is the optical power intensity of the semiconductor laser, "I" is the current flowing through the semiconductor laser, and "$a_1, a_2, a_3, \ldots$" are coefficients of nonlinear Taylor expansion.

Referring to FIG. 2, an input signal is split into a main path and a secondary path ($P_1$, $P_2$). "$I_1$", which is the current flowing through the main path ($P_1$), and "$I_2$", which is the current flowing through the main path ($P_2$), in relation to the signal voltage (V) can be determined according to the following Equations 2 and 3:

$$I_1 = b_1 V + b_2 V^2 + b_3 V^3 + \quad \text{(Equation 2)}$$

$$I_2 = c_1 V + c_2 V^2 + c_3 V^3 + \quad \text{(Equation 3)}$$

If the relationship of "$P_{out}$" to the signal voltage (V) is in accordance with the following Equation 4:

$$P_{out} = k_1 V + k_2 V^2 + k_3 V^3 + \quad \text{(Equation 4)}$$

By introducing $I=I_1=I_2$ into Equation 1 and by comparing Equation 4, we can obtain the following:

$$k_1 = a_1(b_1 + c_1) \quad \text{(Equation 5.1)}$$

$$k_2 = a_2(b_2 + c_2) + a_2(b_1^2 + c_1^2 + 2b_1 c_1) \quad \text{(Equation 5.2)}$$

$$k_3 = a_3(b_3 + c_3) + a_2(2b_1 b_2 + 2c_1 c_2 + b_1 c_2 + b_2 c_1) + a_3(b_1^3 + c_1^3 + 3b_1^2 c_1 + 3b_1 c_1^2) \quad \text{(Equation 5.3)}$$

If the coefficients ($C_I$, I=1, 2, 3, . . . )of the nonlinear current ($I_2$) flowing through the secondary path ($P_2$) can be adjusted such that $$k_2 = k_3 = \ldots = k_n = \ldots = 0 \quad \text{(Equation 6)}$$

$P_{out} = k_1 V$ in Equation 4, which is the ideal aim.

Conventional predistortion circuits are disclosed in U.S. Pat. Nos. 4,992,754, 5,132,639, 5,252,930, and 5,424,680. The following are some of the drawbacks of the predistortion circuits disclosed in the aforesaid U.S. Patents:

1. In U.S. Pat. Nos. 4,992,754 and 5,132,639, two predistortion generators are needed to provide second-order and third-order predistortion compensation, thereby resulting in greater complexity and higher costs.

2. In U.S. Pat. No. 5,252,930, only second-order predistortion compensation can be provided such that the distortion compensating effect is inferior.

SUMMARY OF THE INVENTION

Therefore, the object of the present invention is to provide a predistortion circuit of the aforesaid type which has a relatively simple construction.

According to the present invention, a predistortion circuit includes a first splitter, a first combiner, a distortion signal generator, a second splitter, a third splitter, an even-order signal processing unit, an odd-order signal processing unit, and a second combiner.

The first splitter splits an input signal into primary and secondary electrical paths.

The first combiner is connected to the first splitter via the primary electrical path for combining a main signal on the primary electrical path and a predistorted signal on the secondary electrical path into a single signal for modulating a nonlinear device with predictable distortion characteristics.

The distortion signal generator is disposed in the secondary electrical path and is connected to the first splitter for receiving a branch signal from the first splitter and for producing first and second intermodulation products from the branch signal.

The second splitter is disposed in the secondary electrical path and is connected to the distortion signal generator for receiving the first intermodulation products produced by the distortion signal generator and for outputting two sets of the first intermodulation products.

The third splitter is disposed in the secondary electrical path and is connected to the distortion signal generator for receiving the second intermodulation products produced by the distortion signal generator and for outputting two sets of the second intermodulation products.

The even-order signal processing unit is disposed in the secondary electrical path for receiving and processing one of the sets of the first intermodulation products and one of the sets of the second intermodulation products to generate even-order intermodulation products.

The odd-order signal processing unit is disposed in the secondary electrical path for receiving and processing the other one of the sets of the first intermodulation products and the other one of the sets of the second intermodulation products to generate odd-order intermodulation products.

The second combiner is disposed in the secondary electrical path and is connected to the even-order signal processing unit, the odd-order signal processing unit and the first combiner for receiving and combining the even-order intermodulation products generated by the even-order signal processing unit and the odd-order intermodulation products generated by the odd-order signal processing unit to obtain the predistortion signal that is provided to the first combiner.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
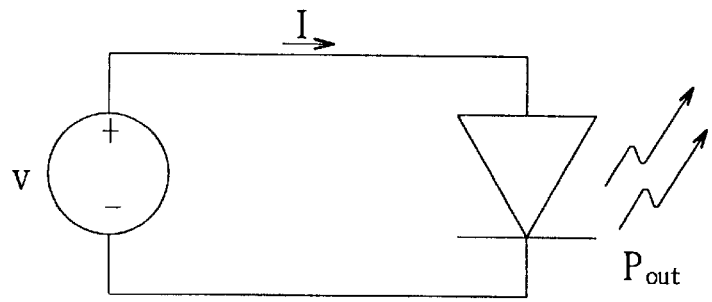
FIG. 1 is a schematic diagram illustrating a semiconductor laser connected across a voltage source.
Figure 2:
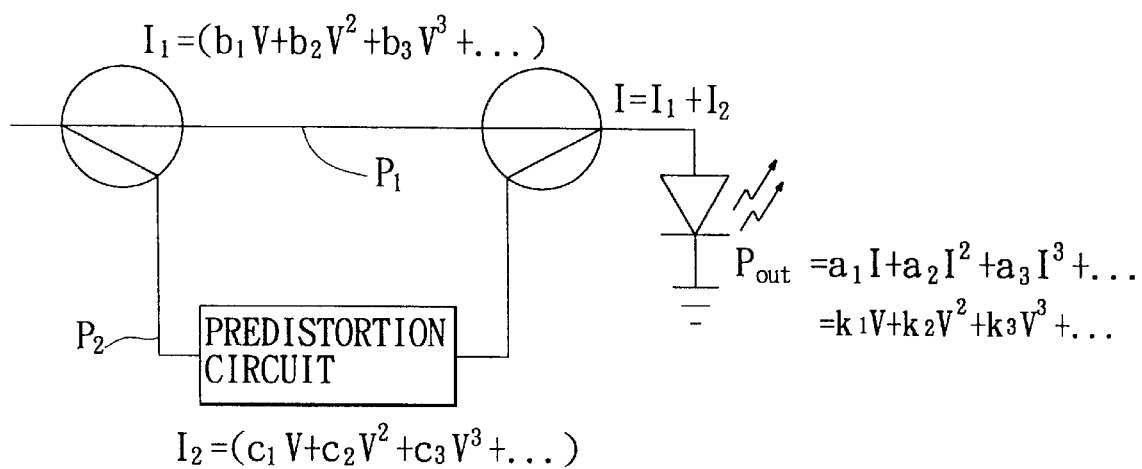
FIG. 2 is a schematic diagram of a conventional optical transmission circuit with a predistortion capability.
Figure 3:
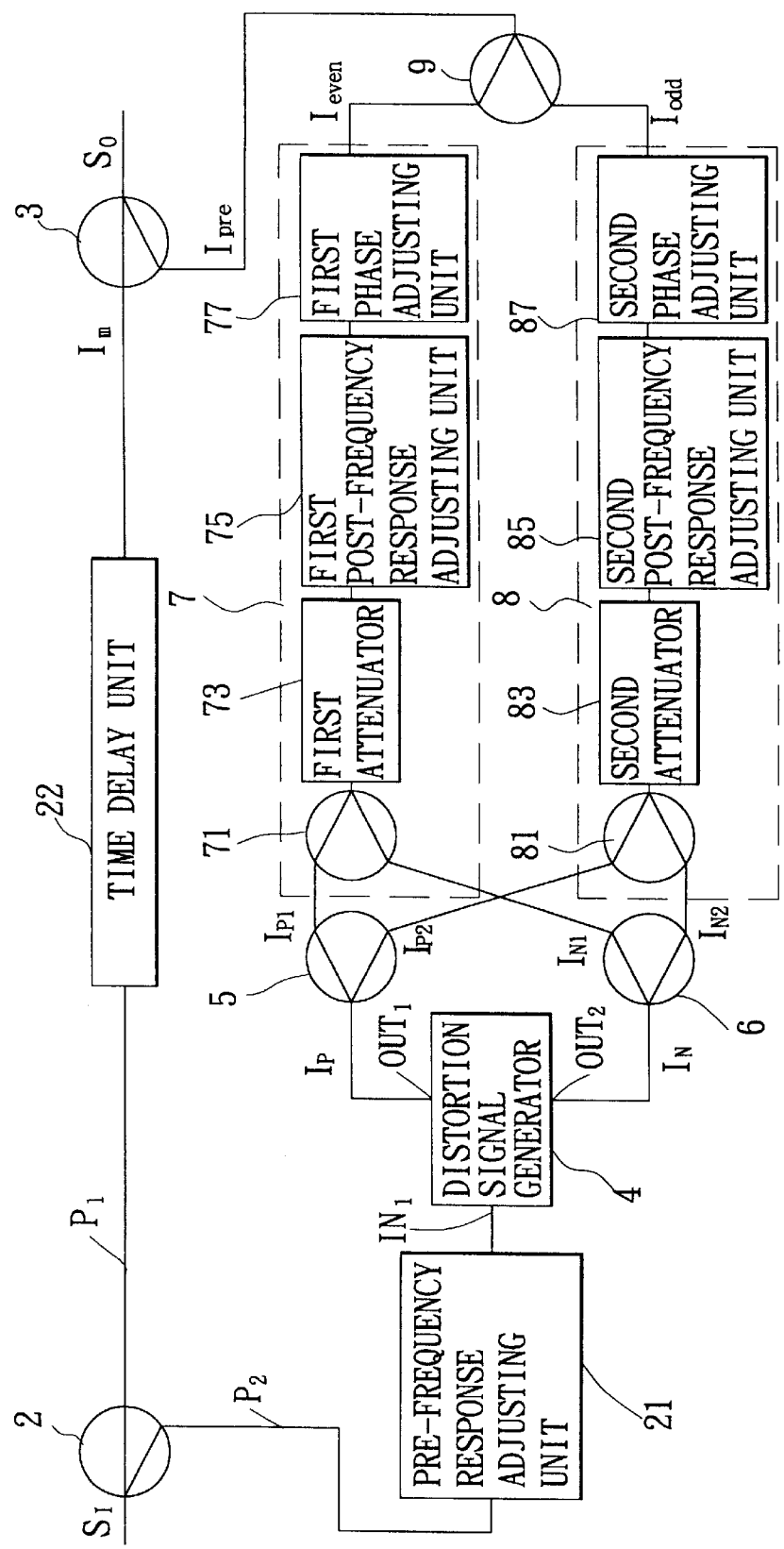
FIG. 3 is a schematic circuit block diagram showing the preferred embodiment of a predistortion circuit according to the present invention.

Referring to FIG. 3, the preferred embodiment of a predistortion circuit according to the present invention is shown to comprise a first splitter 2, a time delay unit 22, a first combiner 3, a pre-frequency response adjusting unit 21, a distortion signal generator 4, a second splitter 5, a third splitter 6, an even-order signal processing unit 7, an odd-order signal processing unit 8, and a second combiner 9.

The first splitter 2, such as a 0° coupler, splits an input signal ($S_I$) into primary and secondary electrical paths ($P_1$, $P_2$).

The first combiner 3, such as a 180° coupler, is connected to the first splitter 2 via the primary electrical path ($P_1$) for combining a main signal ($I_m$) on the primary electrical path ($P_1$) and a predistorted signal ($I_{pre}$) on the secondary electrical path ($P_2$) into a single signal ($S_O$) for modulating a nonlinear device (not shown) with predictable distortion characteristics.

The time delay unit 22, such as conducting wires or coaxial cables, is disposed in the primary electrical path ($P_1$) between the first splitter 2 and the first combiner 3 for minimizing relative phase difference between the primary and secondary electrical paths ($P_1$, $P_2$).

The pre-frequency response adjusting unit 21 is disposed in the secondary electrical path ($P_2$) and is connected to the first splitter 2 for altering a branch signal ($IN_1$) from the first splitter 2 to the distortion signal generator 4 in a conventional frequency dependent manner.

The distortion signal generator 4 is disposed in the secondary electrical path ($P_2$) and is connected to the pre-frequency response adjusting unit 21 for receiving the branch signal ($IN_1$) from the pre-frequency response adjusting unit 21 and for producing first and second intermodulation products ($I_P$, $I_N$) from the branch signal ($IN_1$). The distortion signal generator 4 has a first output end ($OUT_1$) for outputting the first intermodulation products ($I_P$), and a second output end ($OUT_2$) for outputting the second intermodulation products ($I_N$). The first intermodulation products ($I_P$) include odd and even order components of the same polarity, whereas the second intermodulation products ($I_N$) include odd and even order components of opposite polarity.

The second splitter 5, such as a 0° coupler, is disposed in the secondary electrical path ($P_2$) and is connected to the distortion signal generator 4 for receiving the first intermodulation products ($I_P$) produced by the distortion signal generator 4 and for outputting two sets ($I_{P1}$, $I_{P2}$) of the first intermodulation products ($I_P$) with current transformation ratio of $-e_1$ dB and $-e_2$ dB, respectively.

The third splitter 6, which has the same characteristics as the second splitter 5, is disposed in the secondary electrical path ($P_2$) and is connected to the distortion signal generator 4 for receiving the second intermodulation products ($I_N$) produced by the distortion signal generator 4 and for outputting two sets ($I_{N1}$, $I_{N2}$) of the second intermodulation products ($I_N$) with insertion losses of $e_1$ dB and $e_2$ dB, respectively.

The even-order signal processing unit 7 is disposed in the secondary electrical path ($P_2$) for receiving and processing the set ($I_{P1}$) of the first intermodulation products ($I_P$) and the set ($I_{N1}$) of the second intermodulation products ($I_N$) to generate even-order intermodulation products ($I_{even}$). The even-order signal processing unit 7 includes a third combiner 71, a first attenuator 73, a first post-frequency response adjusting unit 75 and a first phase adjusting unit 77. The third combiner 71, such as a 3 dB 0° coupler, receives and combines the set ($I_{P1}$) of the first intermodulation products ($I_P$) and the set ($I_{N1}$) of the second intermodulation products ($I_N$) to obtain the even-order intermodulation product ($I_{even}$). The first attenuator 73 is connected in series with the third combiner 71. The first post-frequency response adjusting unit 75 is connected in series with the first attenuator 73 for altering the even-order intermodulation products ($I_{even}$) in a conventional frequency dependent manner. The first phase adjusting unit 77 is connected in series with the first post-frequency response adjusting unit 75 for altering the phase of the even-order intermodulation products ($I_{even}$) in a known manner.

The odd-order signal processing unit 8 is disposed in the secondary electrical path ($P_2$) for receiving and processing the set ($I_{P2}$) of the first intermodulation products ($I_P$) and the set ($I_{N2}$) of the second intermodulation products ($I_N$) to generate even-order intermodulation products ($I_{odd}$). The odd-order signal processing unit 8 includes a fourth combiner 81, a second attenuator 83, a second post-frequency response adjusting unit 85 and a second phase adjusting unit 87. The fourth combiner 81, such as a 3 dB 180° coupler, receives and combines the set ($I_{P2}$) of the first intermodulation products ($I_P$) and the set ($I_{N2}$) of the second intermodulation products ($I_N$) to obtain the odd-order intermodulation products ($I_{odd}$). The second attenuator 83 is connected in series with the fourth combiner 81. The second post-frequency response adjusting unit 85 is connected in series with the second attenuator 83 for altering the odd-order intermodulation products ($I_{odd}$) in a conventional frequency dependent manner. The second phase adjusting unit 87 is connected in series with the second post-frequency response adjusting unit 85 for altering the phase of the odd-order intermodulation products ($I_{odd}$) in a known manner.

The second combiner 9, such as a 3 dB 0° coupler, is disposed in the second electrical path ($P_2$) and is connected to the first phase adjusting unit 77 of the even-order signal processing unit 7, the second phase adjusting unit 87 of the odd-order signal processing unit 8 and the first combiner 3 for receiving and combining the even-order intermodulation products ($I_{even}$) generated by the odd-order signal processing unit 7 and the odd-order intermodulation products ($I_{odd}$) generated by the odd-order signal processing unit 8 to obtain the predistortion signal ($I_{pre}$) that is provided to the first combiner 3.

When the input signal ($S_I$) is received by the first splitter 2 and is split into the primary and secondary paths ($P_1$, $P_2$), the branch signal ($IN_1$) on the secondary path ($P_2$) is adjusted by the pre-frequency response adjusting unit 21 and is inputted to the distortion signal generator 4 so as to generate the first and second intermodulation products ($I_P$, $I_N$). The relationship of the first and second intermodulation products ($I_P$, $I_N$) relative to an input voltage ($V_S$) is given in the following Equations 7 and 8:

$$I_P = d_1V + d_2V^2 + d_3V^3 + \quad \text{(Equation 7)}$$

$$I_N = -d_1V + d_2V^2 - d_3V^3 + \quad \text{(Equation 8)}$$

Where all coefficients of expansion in $I_P$ are positive, even-order coefficients are positive in $I_N$, and odd-order coefficients are negative in $I_N$.

The first and second intermodulation products ($I_P$, $I_N$) are split into four sets ($I_{P1}$, $I_{N1}$, $I_{P2}$, $I_{N2}$) of the first and second intermodulation products ($I_P$, $I_N$) by the second and third splitters 5, 6, respectively, in the following manner:

$$I_{P1} = 10^{-e1/10}(d_1V + d_2V^2 + d_3V^3 +) \quad \text{(Equation 9)}$$

$$I_{P2} = 10^{-e2/10}(d_1V + d_2V^2 + d_3V^3 +) \quad \text{(Equation 10)}$$

$$I_{N1} 10^{-e1/10}(-d_1V + d_2V^2 - d_3V^3 +) \quad \text{(Equation 11)}$$

$$I_{N2} = 10^{-e2/10}(-d_1V + d_2V^2 - d_3V^3 +) \quad \text{(Equation 12)}$$

Then, the third comniber 71 of the even-order signal processing unit 7 combines $I_{P1}$ and $I_{N1}$ to obtain the even-order intermodulation products ($I_{even}$), as defined in the following Equation 13:

$$I_{even} = 10^{-e1/10}(d_2V_S^2 + d_4V_S^4 + d_6V_S^6 +) \quad \text{(Equation 13)}$$

and the fourth combiner 81 of the odd-order signal processing unit 8 combines $I_{P2}$ and $I_{N2}$ to obtain the odd-order intermodulation products ($I_{odd}$), as defined in the following Equation 14:

$$I_{odd} = 10^{-e2/10}(d_1V_S + d_3V_S^3 + d_5V_S^5 + \ldots) \quad \text{(Equation 14)}$$

Notice that the length of conducting wires between the components must be adjusted to maintain the same phase delay when $I_{P1}$, $I_{N1}$, $I_{P2}$, $I_{N2}$ are inputted to the third and fourth combiners 71, 81.

Eventually, $I_{even}$ through the first attenuator 73, the first post-frequency response adjusting unit 75 and the first phase adjusting unit 77, and $I_{odd}$ through the second attenuator 83, the second post-frequency response adjusting unit 85 and the second phase adjusting unit 87 are combined by the second combiner 9 to form $I_{pre}$.

Figure 5:
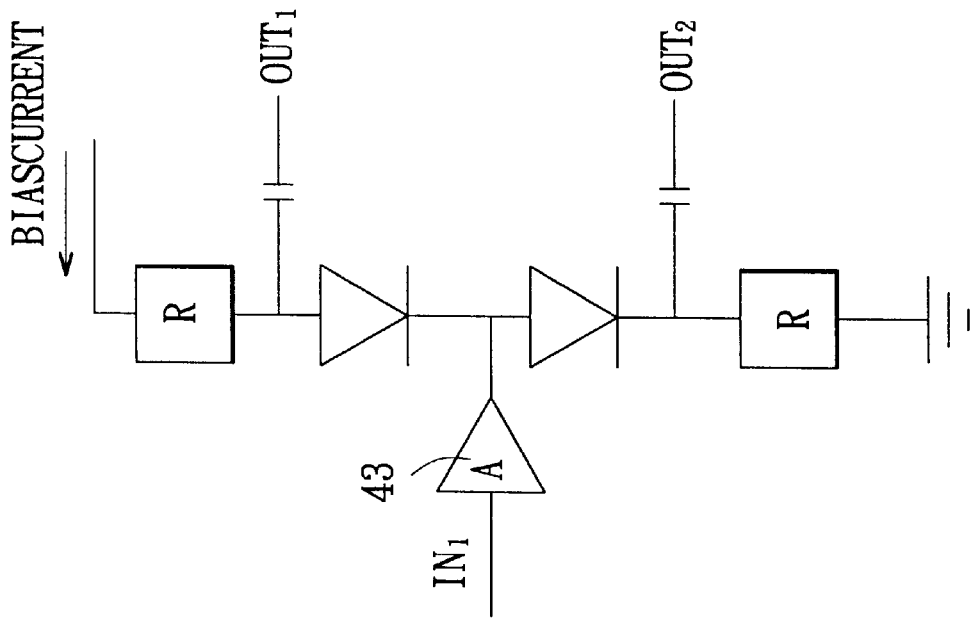
FIG. 5 is a schematic electrical circuit diagram illustrating another example of the distortion signal generator of the preferred embodiment.
Figure 4:
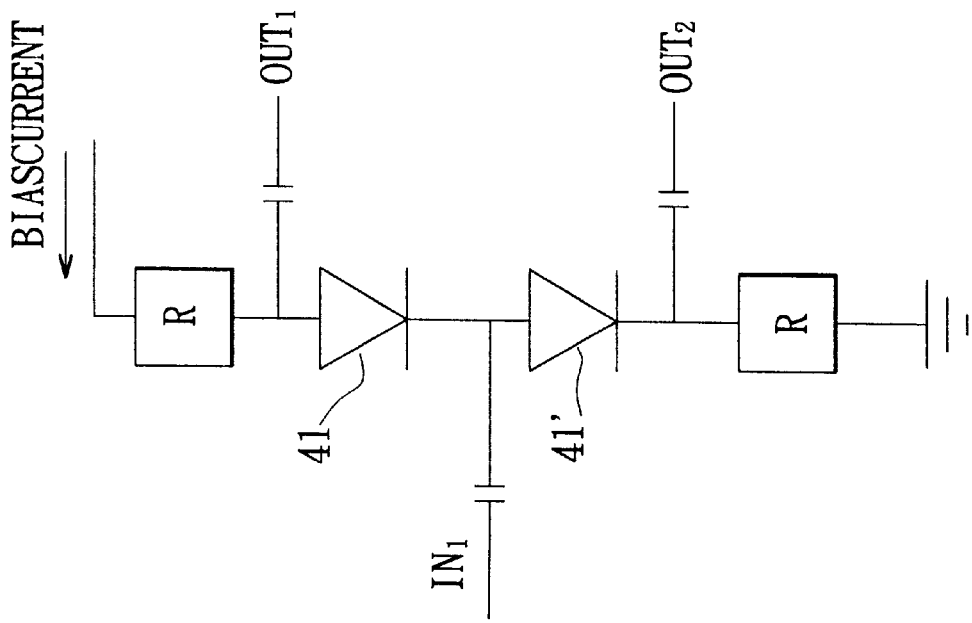
FIG. 4 is a schematic electrical circuit diagram illustrating an example of a distortion signal generator of the preferred embodiment.
Figure 6:
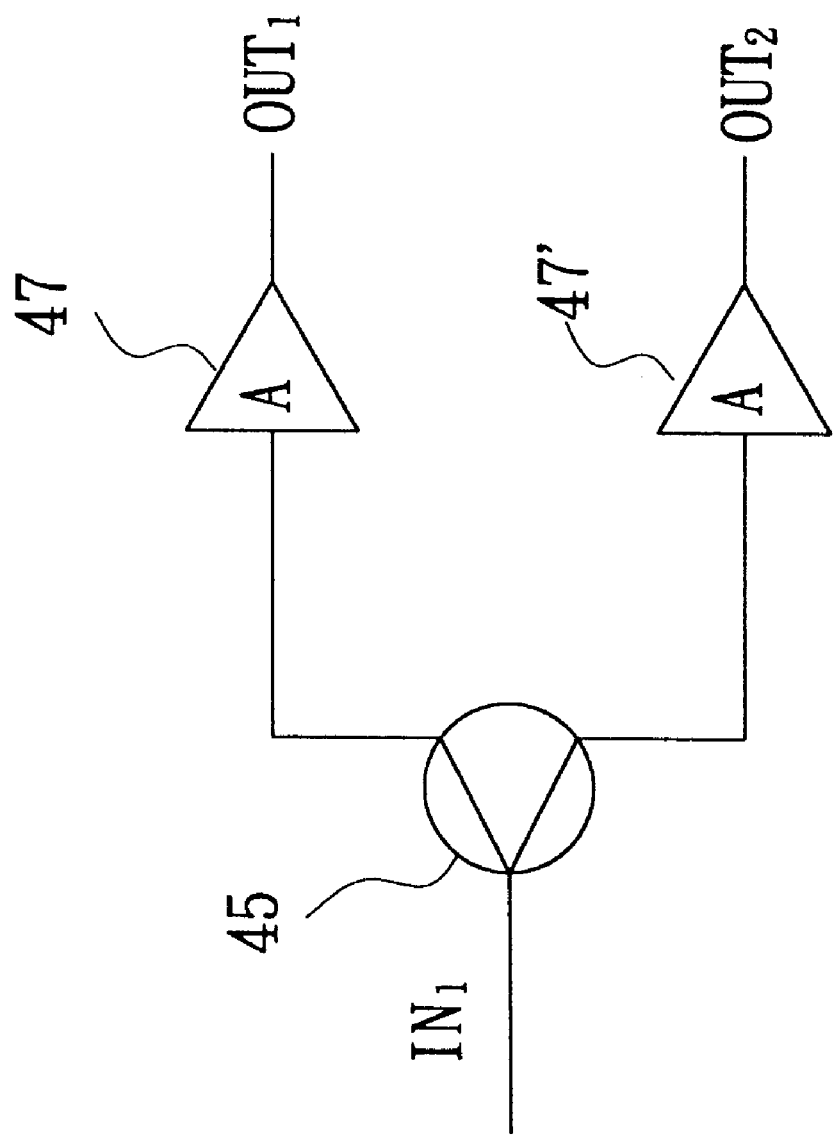
FIG. 6 is a schematic electrical circuit diagram illustrating a third example of the distortion signal generator of the preferred embodiment.

FIGS. 4 to 6 illustrate three examples of the distortion signal generator 4. In FIG. 4, diodes 41, 41' are connected to each other in series and are high-frequency nonlinear devices. In FIG. 5, adding an amplifier 43 is added to the signal generator of FIG. 4 to magnify the nonlinear component in the secondary path. In FIG. 6, after a splitter 45, such as a 3 dB 180° coupler, receives the branch signal $IN_1$, two nonlinear amplifiers 47, 47' are provided to output $I_P$, $I_N$. The amplifiers 47, 47' can be formed from bipolar or field effect transistors in a known manner.

The following are some of the advantages of the present invention:

1. Only one distortion signal generator is used in the present invention to generate the even-order and odd-order intermodulation products ($I_{even}$, $I_{odd}$), thereby resulting in less complexity and lower costs.

2. The even-order and odd-order intermodulation products ($I_{even}$, $I_{odd}$) are generated simultaneously for better distortion compensation.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A predistortion circuit, comprising:

a first splitter for splitting an input signal into primary and secondary electrical paths;

a first combiner connected to the first splitter via the primary electrical path for combining a main signal on the primary electrical path and a predistorted signal on the secondary electrical path into a single signal for modulating a nonlinear device with predictable distortion characteristics;

a distortion signal generator disposed in the secondary electrical path and connected to the first splitter for receiving a branch signal from the first splitter and for producing first and second intermodulation products from the branch signal;

a second splitter disposed in the secondary electrical path and connected to the distortion signal generator for receiving the first intermodulation products produced by the distortion signal generator and for outputting two sets of the first intermodulation products;

a third splitter disposed in the secondary electrical path and connected to the distortion signal generator for receiving the second intermodulation products produced by the distortion signal generator and for outputting two sets of the second intermodulation products;

an even-order signal processing unit disposed in the secondary electrical path for receiving and processing one of the sets of the first intermodulation products and one of the sets of the second intermodulation products to generate even-order intermodulation products;

an odd-order signal processing unit disposed in the secondary electrical path for receiving and processing the other one of the sets of the first intermodulation products and the other one of the sets of the second intermodulation products to generate odd-order intermodulation products; and a second combiner disposed in the secondary electrical path and connected to the even-order signal processing unit, the odd-order signal processing unit and the first combiner for receiving and combining the even-order intermodulation products generated by the even-order signal processing unit and the odd-order intermodulation products generated by the odd-order signal processing unit to obtain the predistortion signal that is provided to the first combiner.

2. The predistortion circuit as claimed in claim 1, further comprising a time delay unit in the primary electrical path between the first splitter and the first combiner for minimizing relative phase difference between the primary and secondary electrical paths.

3. The predistortion circuit as claimed in claim 1, further comprising a pre-frequency response adjusting unit disposed in the secondary electrical path and connected between the first splitter and the distortion signal generator for altering the branch signal to the distortion signal generator in a frequency dependent manner.

4. The predistortion circuit as claimed in claim 1, wherein the first intermodulation products include odd and even order components of the same polarity, and the second intermodulation products include odd and even order components of opposite polarity.

5. The predistortion circuit as claimed in claim 1, wherein the even-order signal processing unit includes a third combiner receiving and combining said one of the sets of the first intermodulation products and said one of the sets of the second intermodulation products to obtain the even-order intermodulation products, a first attenuator connected in series with the third combiner, a first post-frequency response adjusting unit connected in series with the first attenuator for altering the even-order intermodulation products in a frequency dependent manner, and a first phase adjusting unit connected in series between the first post-frequency response adjusting unit and the second combiner.

6. The predistortion circuit as claimed in claim 1, wherein the odd order signal processing unit includes a fourth combiner receiving and combining said other one of the sets of the first intermodulation products and said other one of the sets of the second intermodulation products to obtain the odd-order intermodulation products, a second attenuator connected in series with the fourth combiner, a second post-frequency response adjusting unit in series with the second attenuator for altering the odd-order intermodulation products in a frequency dependent manner, and a second phase adjusting unit connected in series between the second post-frequency response adjusting unit and the second combiner.

* * * * *